United States Patent [19]
Nielsen et al.

[11] Patent Number: 5,870,325
[45] Date of Patent: Feb. 9, 1999

[54] MEMORY SYSTEM WITH MULTIPLE ADDRESSING AND CONTROL BUSSES

[75] Inventors: Michael J. K. Nielsen, San Jose; Brian Kindle, Sunnyvale; Linda S. Gardner, Saratoga; Zahid S. Hussain, Palo Alto, all of Calif.

[73] Assignee: Silicon Graphics, Inc., Mountain View, Calif.

[21] Appl. No.: 60,451

[22] Filed: Apr. 14, 1998

[51] Int. Cl.⁶ ........................................................ G11C 7/00
[52] U.S. Cl. ................................................. 365/63; 365/52
[58] Field of Search .......................... 365/63, 52, 230.03

[56] References Cited

U.S. PATENT DOCUMENTS

| | | | |
|---|---|---|---|
| 5,089,993 | 2/1992 | Neal et al. ................................. | 365/63 |
| 5,272,664 | 12/1993 | Alexander et al. ....................... | 365/52 |
| 5,278,801 | 1/1994 | Dresser et al. ...................... | 365/230.02 |
| 5,371,866 | 12/1994 | Cady ....................................... | 395/400 |
| 5,440,519 | 8/1995 | Mart et al. ................................ | 365/52 |
| 5,513,135 | 4/1996 | Dell et al. ................................. | 365/52 |
| 5,532,954 | 7/1996 | Bechtolsheim et al. .................. | 365/52 |
| 5,566,122 | 10/1996 | Schaefer ............................. | 365/230.03 |
| 5,572,457 | 11/1996 | Michael .................................... | 365/63 |
| 5,661,677 | 8/1997 | Rondeau, II et al. ..................... | 365/63 |
| 5,701,270 | 12/1997 | Rao ................................... | 365/230.03 |
| 5,745,428 | 4/1998 | Rao ................................... | 365/230.03 |

*Primary Examiner*—Vu A. Le
*Attorney, Agent, or Firm*—Wagner, Murabito & Hao

[57] ABSTRACT

A memory system that includes a memory controller and memory modules that provide address and control signals to groups of memory components through multiple busses. In one embodiment, each memory module is coupled to an address/control buss. The use of multiple address/control busses provides the necessary bandwidth so as to allow for fast access and control of memory components. Memory components are grouped into banks of memory components with each bank including three memory components. Memory modules are configured with one, two, four, or more banks of memory components on a given memory module. In one embodiment, the memory system includes six 48-bit memory modules that use SDRAM memory components. The six memory modules are used in a set to form a 288-bit memory word. When 16 Mbit or 64 Mbit memory components are used, this configuration gives a range of memory configurations from 32 megabytes to 2 gigabytes.

22 Claims, 21 Drawing Sheets

MEMORY SYSTEM WITH MULTIPLE ADDRESSING AND CONTROL BUSSES

TECHNICAL FIELD

The present claimed invention relates to the field of memory storage devices. More particularly, the present invention relates to a memory storage device which includes separate pathways for address and control signals to groups of memory devices such that groups of memory devices may be independently addressed and controlled.

BACKGROUND ART

Prior art systems that include Single Inline Memory Module (SIMM) and Dual Inline Memory Module (DIMM) memory devices have two-bus structures. That is, one bus is used for data transfer (hereinafter the "data bus") and a second bus (hereinafter the "address/control bus") is used for address and control of individual memory components. Typically, Dynamic Random Access Memory (DRAM) semiconductor devices and Synchronous Dynamic Random Access Memory (SDRAM) devices are used as memory components.

Recent computer systems require more graphics capabilities and faster graphics performance. These computer systems which require advanced graphics capabilities have greatly increased the demand on the address/control bus. This is particularly true in systems that have unified graphics and system memory. Memory systems that have unified graphics and system memory require high performance address/control bandwidth, and low address/control latency. In addition, system memory applications require a broad range of memory component counts so as to allow a wide range of application configurations. Thus, high memory component capacity is required.

In order to meet the demands of unified graphics and system memory and 3D graphics requirements, some prior art memory systems use a buffer (hereinafter "address/control buffer"). These prior art memory modules typically include from four to eighteen memory components on each memory module. Though the use of an address/control buffer increases the apparent address/control bandwidth, it also gives high address/control signal latency.

Recent attempts to meet the demands of unified graphics and system memory and 3D graphics requirements include architectures that provide one-to-one correspondence of address versus data between the memory controller and each memory component. That is, the memory controller can address each memory component through a separate address/control connection. However, this type of memory system requires advanced electrical signaling levels. In addition, the number of memory components is limited by the capacity of the memory controller. That is, the direct one to one correspondence of address/control signals with data signals gives a signal count requirement that is too great for the memory controller to handle in high-end applications.

New graphics rendering engines require a new generation of addresses to memory components every memory clock period in order to achieve high 3D graphics performance. In addition, for 3D graphics applications it is desirable to address different parts of a memory word with unique addresses. This allows for access to unaligned data in a single memory clock period. This cannot be done using prior art memory systems and prior art memory modules. In addition, the large electrical length and loading of driving a prior art memory modules with a width of nine or more memory components gives a significant disruption to the electrical characteristics of the memory address/control signals supplied from the memory controller. This prevents transmission of address/control signals at the same rate as data signals.

Using prior art architectures, it is possible to achieve the needed address/control performance by limiting the memory components. However, by limiting the number of memory components, it is not possible to achieve the high count of memory components required for large system memory configurations. When intermediate address/control buffering is used between the memory controller and the memory components, the large capacity of memory components required for system memory is achievable. However the address/control buffering increases the latency to address and control the memory components, resulting in reduced graphics performance.

What is needed is a memory system and memory module that provides for high bandwidth addressing and control of memory components. In addition, a memory system and memory module that has low latency is required. Moreover, a memory system and memory module that does not require advanced electrical signaling is required. Furthermore, a memory system and memory module that has a high memory component capacity is required. Also, a memory system and memory module which may be addressed such that different parts of a memory word may be separately addressed with unique addresses is required so that unaligned data may be accessed in a single memory clock period. In addition, a memory system and memory module which allows for the transmission of address/control signals at the same rate as data signals is required. The present invention provides a simple, elegant solution to the above needs.

DISCLOSURE OF THE INVENTION

The present invention provides a memory system and memory module that has a high bandwidth for address and control signaling. The memory system and memory module of the present invention provides address and control signals to groups of memory components through multiple busses.

A memory system that includes multiple address/control busses for coupling signals between a memory controller and memory modules is disclosed. In one embodiment, each memory module is coupled to an address/control buss. The use of multiple address/control busses provides the necessary bandwidth so as to allow for fast access and control of memory components.

In one embodiment, memory components are grouped into "banks" of memory components with each bank including a group of memory components. In one embodiment, each bank of memory components includes three memory components. When DRAM devices are used as memory components, each bank of memory components includes three DRAM devices. Memory modules are configured with one, two, four, or more banks of memory components on a given memory module.

Typical prior art memory systems use a single address/control bus to access a memory module with nine memory components to achieve the required data width. However, the memory system of the present invention allows for achieving this same data width by using three memory modules, each with three memory components. In addition, each memory module may have one, two, three, or four banks of memory components to increase the memory capacity of a given memory module. This results in a reduction in the physical and logical width of the memory modules, allowing the memory address/control signals to be bussed to several memory modules in the same fashion as the data signals. Thus, the present invention provides the same signal bandwidth for address/control signals as is provided for data signals.

In one embodiment, the memory system includes six 48-bit memory modules that use SDRAM memory components. The six memory modules are used in a set to form a 288-bit memory word. When 16 Mbit or 64 Mbit memory components are used, this configuration gives a range of memory configurations from 32 megabytes (Mbytes) to 2 gigabytes (Gbytes).

The memory components of the present invention may be addressed such that different parts of a memory word may be separately addressed with a unique address. In addition, the memory system and memory module of the present invention provides sufficient bandwidth for rapid addressing and control of memory components. This rapid addressing and control is sufficient to meet the needs of demanding high-end graphics applications.

The memory module of the present invention does not have one to one correspondence between memory components and address/control pathways. Thus, complex advanced electrical signaling is not required and the total number of memory components is not restricted as is the case with prior art systems that have one-to-one correspondence. In addition, since the memory system of the present invention does not require intermediate buffers between the memory controller and the memory components as is required in comparable prior art systems, there is no increase in the latency of supplying address/control information to the memory components.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 1:
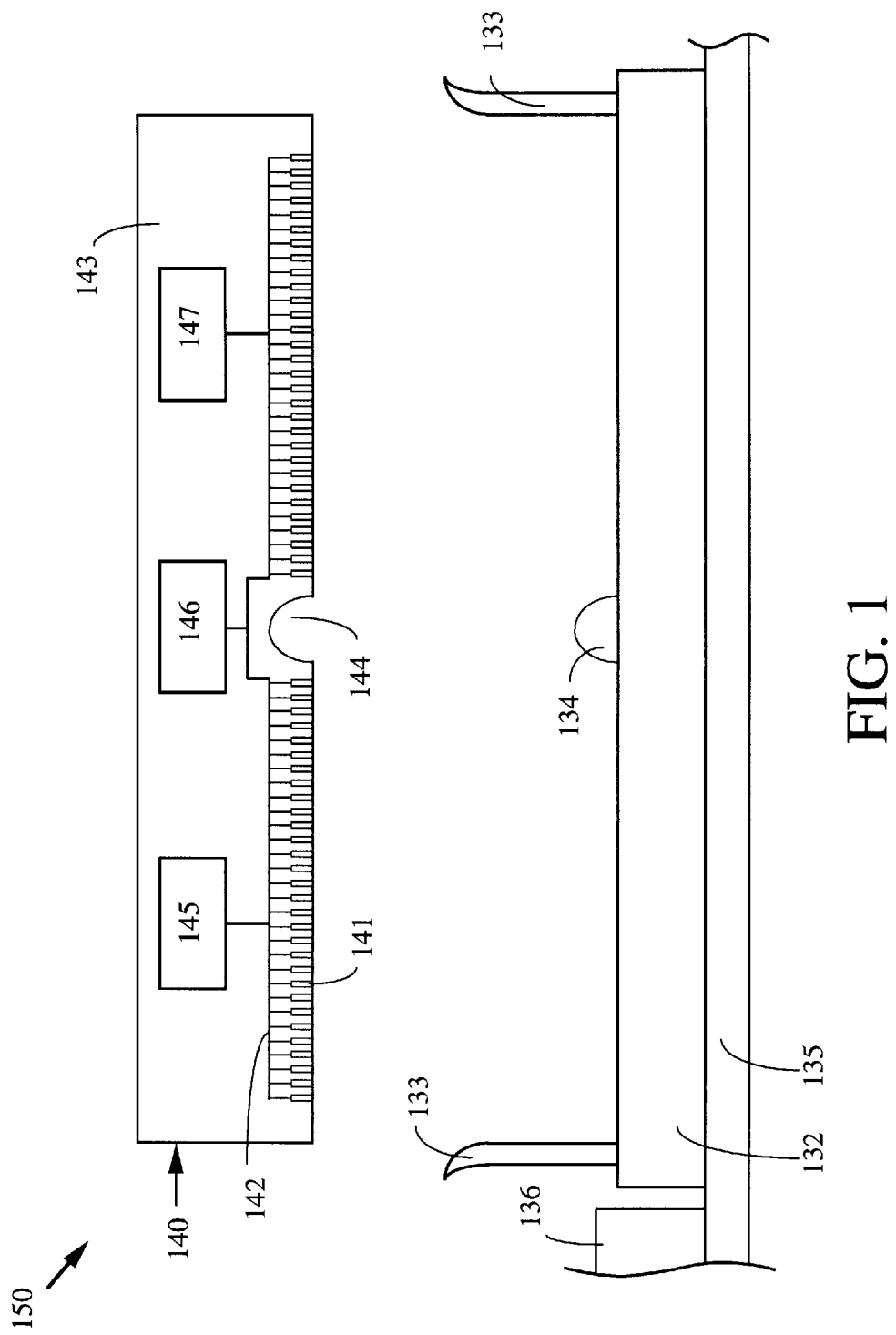
FIG. 1 is a diagram of a memory system showing a memory controller, a memory module, and a connector receptacle adapted to receive a memory module in accordance with the present claimed invention.

Referring now to FIG. 1, memory system 150 is shown to include a memory controller 136, a memory module 140, and a connector receptacle 132. Connector receptacle 132 and memory controller 136 are shown to be disposed on circuit board 135. Connector receptacle 132 and memory controller 136 are electrically connected by conductive traces (not shown) on circuit board 135.

Continuing with FIG. 1, memory module 140 is shown to include circuit card 143 and memory components 145–147. Memory components 145–147 are attached to circuit board 143 and are electrically connected to contact pads 141 via conductive traces 142. In one embodiment, memory module 140 is a 120 pin DIMM and memory components 145–147 are DRAM devices. In one embodiment, the DRAM devices that are used are SDRAM devices.

In operation, memory module 140 is inserted into connector receptacle 132 such that electrical contact is made between sockets (not shown) in connector receptacle 132 and contact pads 141. This electrically connects the electrical circuits on memory module 140 to the electrical components located on circuit board 135. Clips 133 hold memory module 140 securely in place when it is inserted into connector receptacle 132. Alignment notch 134 engages indention 144 on memory module 140 so as to provides for proper alignment and positioning of memory module 140.

Figure 2:
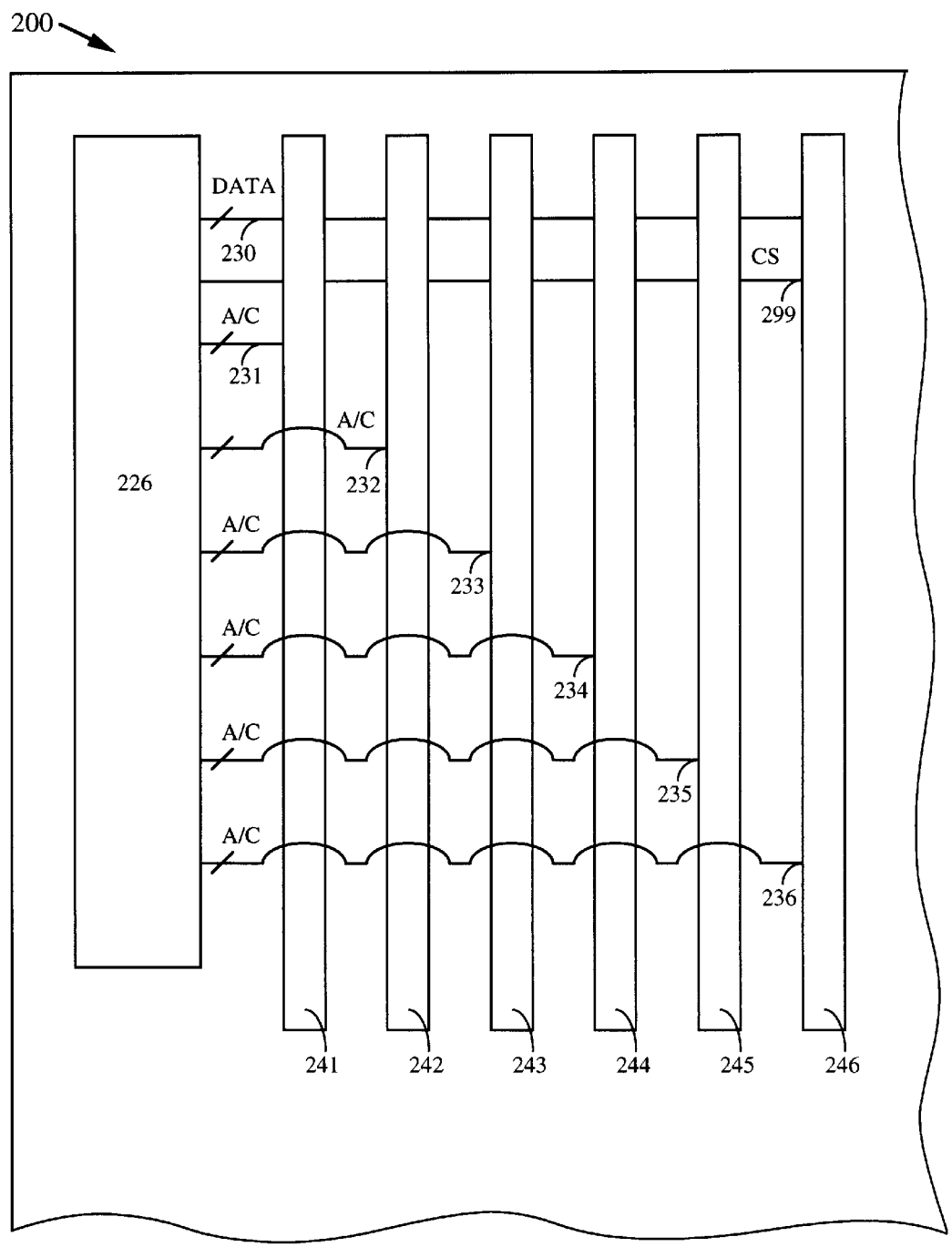
FIG. 2 is a top view illustrating a memory system that is adapted to receive six memory modules in accordance with the present claimed invention.

FIG. 2 shows an example of a memory system 200 that is adapted to receive up to six system memory modules. Memory system 200 is shown to include memory controller 226 that is electrically connected to connector receptacles 241–246 by data bus 230, chip select bus 299 and address/control busses 231–236. Data bus 230 connects to each of connector receptacles 241–246. Chip select bus 299 also connects to each of connector receptacles 241–246. Each of address/control busses 231–236 connects to one of connector receptacles 241–246. In the embodiment shown in FIG. 2, address/control bus 231 couples to connector receptacle 241 and address/control bus 232 couples to connector receptacle 242. Similarly, address/control bus 233 couples to connector receptacle 243 and address/control bus 234 couples to connector receptacle 244. Address/control bus 235 couples to connector receptacle 245 and address/control bus 236 couples to connector receptacle 246. Though memory system 200 is shown to include six memory module connectors, in an alternate embodiment, more connector receptacles could be used (with some or all of address/data busses 241–246 connecting to multiple connector receptacles).

Figure 3:
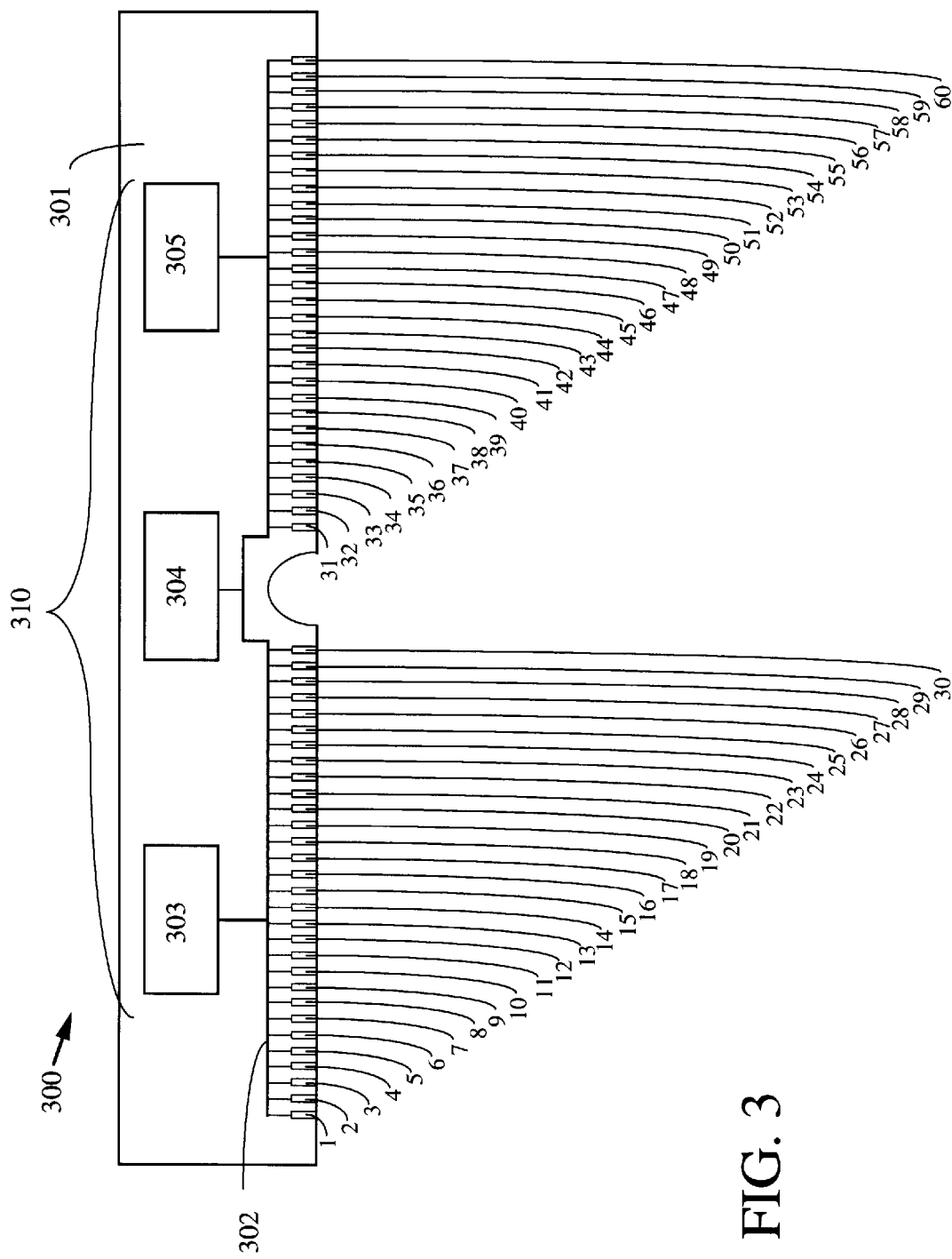
FIG. 3 is front side view of a memory module that includes two banks of memory components in accordance with the present claimed invention.

FIGS. 3–7 show a specific embodiment of a memory module that includes two sets of memory components. Referring now to FIG. 3, memory module 300 is shown to include a first bank of memory components, shown as bank 310, which includes memory components 303–305. Memory components 303–305 are attached to circuit card 301 and are selectively electrically coupled to contact pads 1–120 by conductive traces 302.

Figure 4:
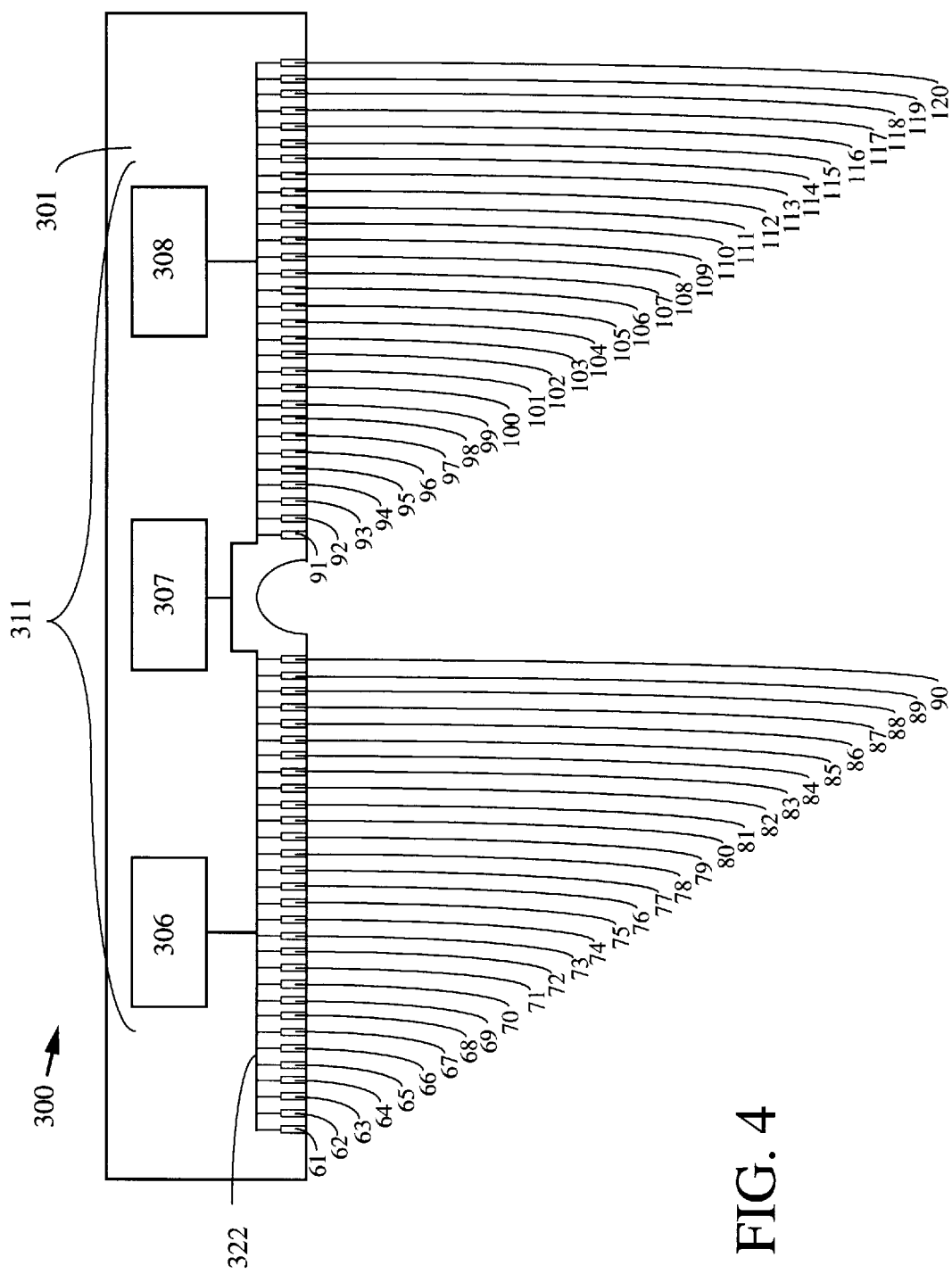
FIG. 4 is rear side view of the memory module shown in FIG. 3 in accordance with the present claimed invention.

Referring now to FIG. 4, the opposite side of memory module 300 is shown to include a second bank of memory components. This second bank of memory components, shown as bank 311, includes memory components 306–308. Memory components 306–308 are selectively electrically coupled to contact pads 1–120 by conductive traces 312.

Figure 5:
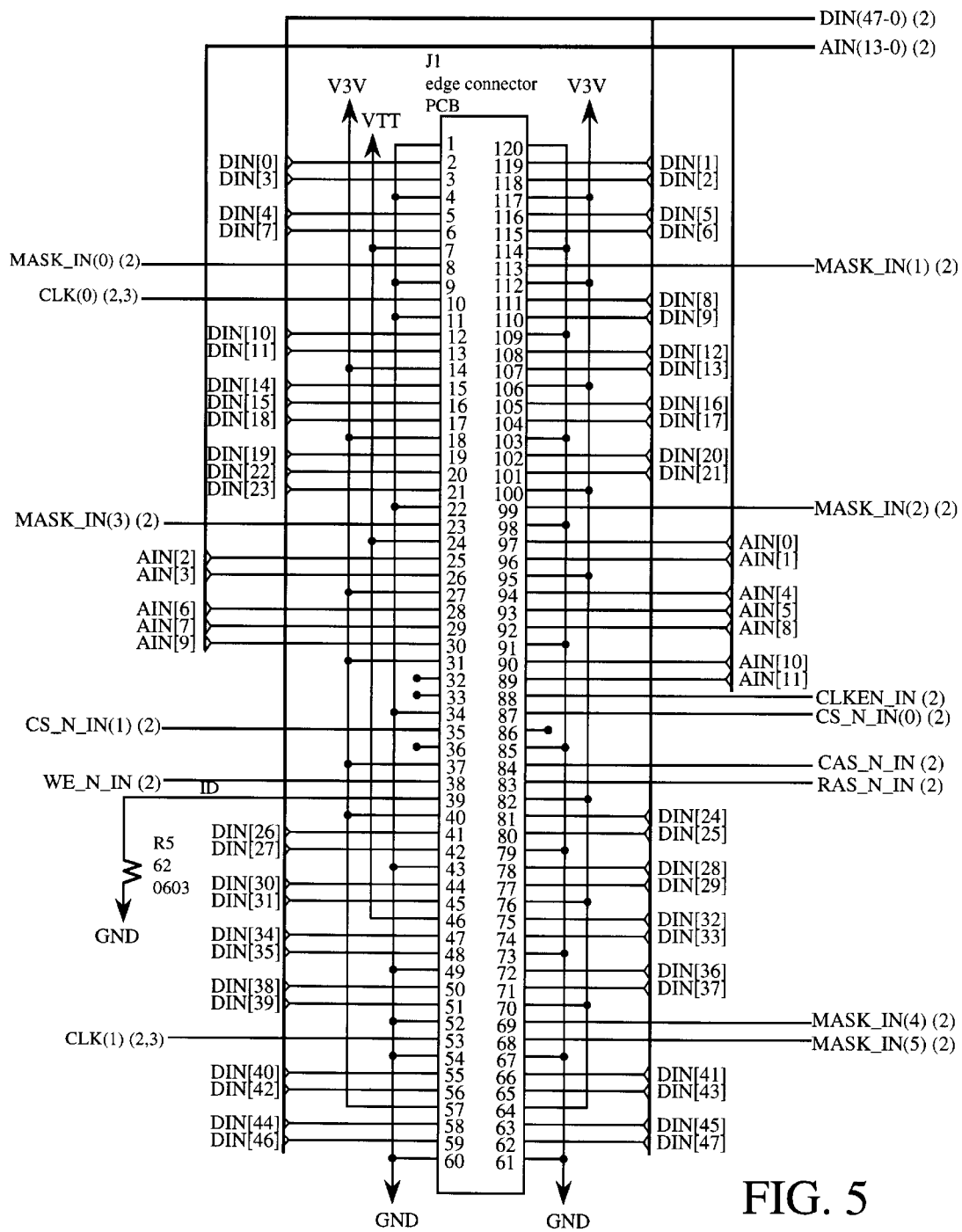
FIG. 5 is a diagram showing a memory module that includes two banks of memory components in accordance with the present claimed invention.
Figure 6:
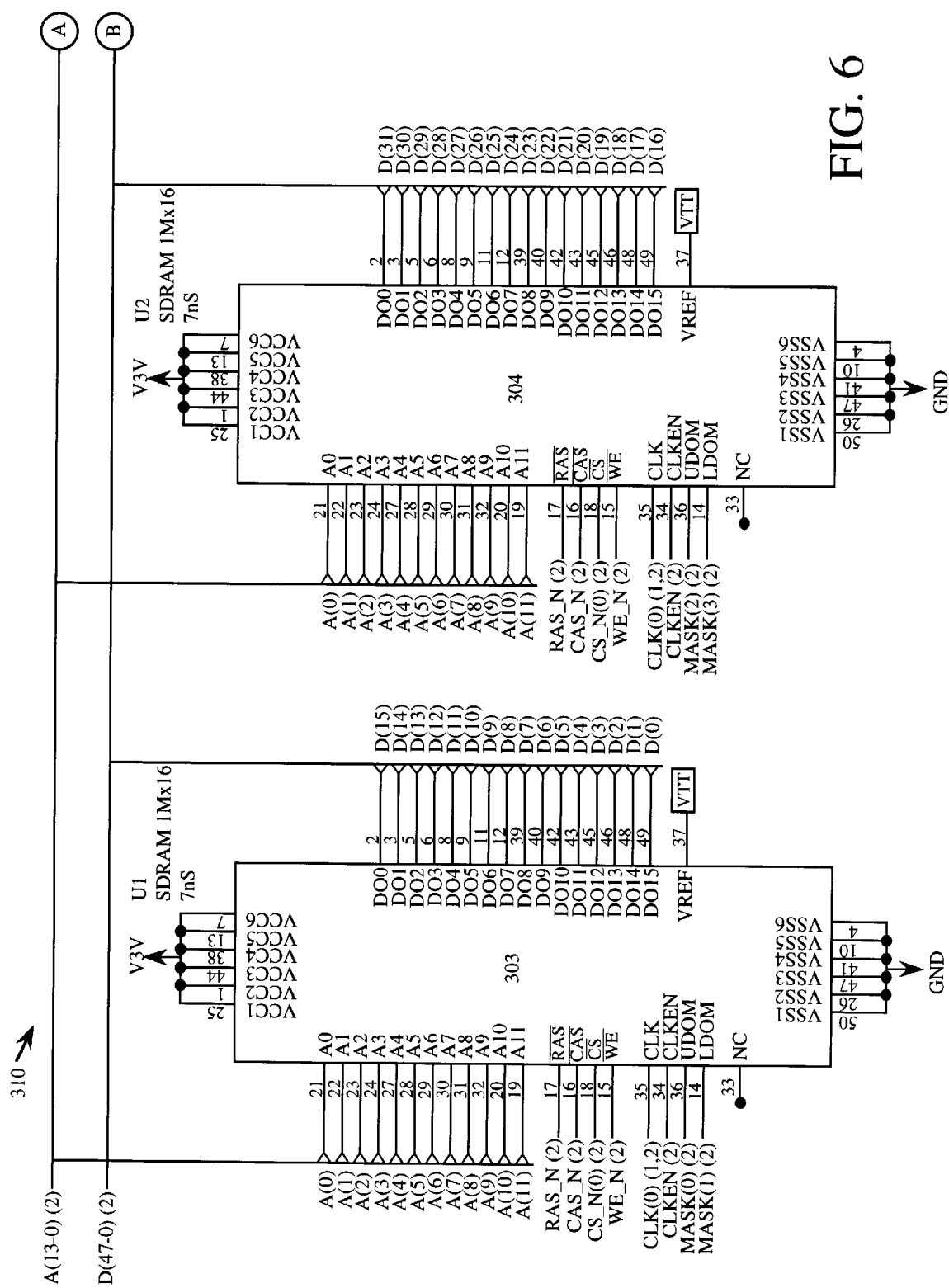
FIG. 6 is a diagram showing a first bank of memory components on a memory module that includes two banks of memory components in accordance with the present claimed invention.
Figure 6:
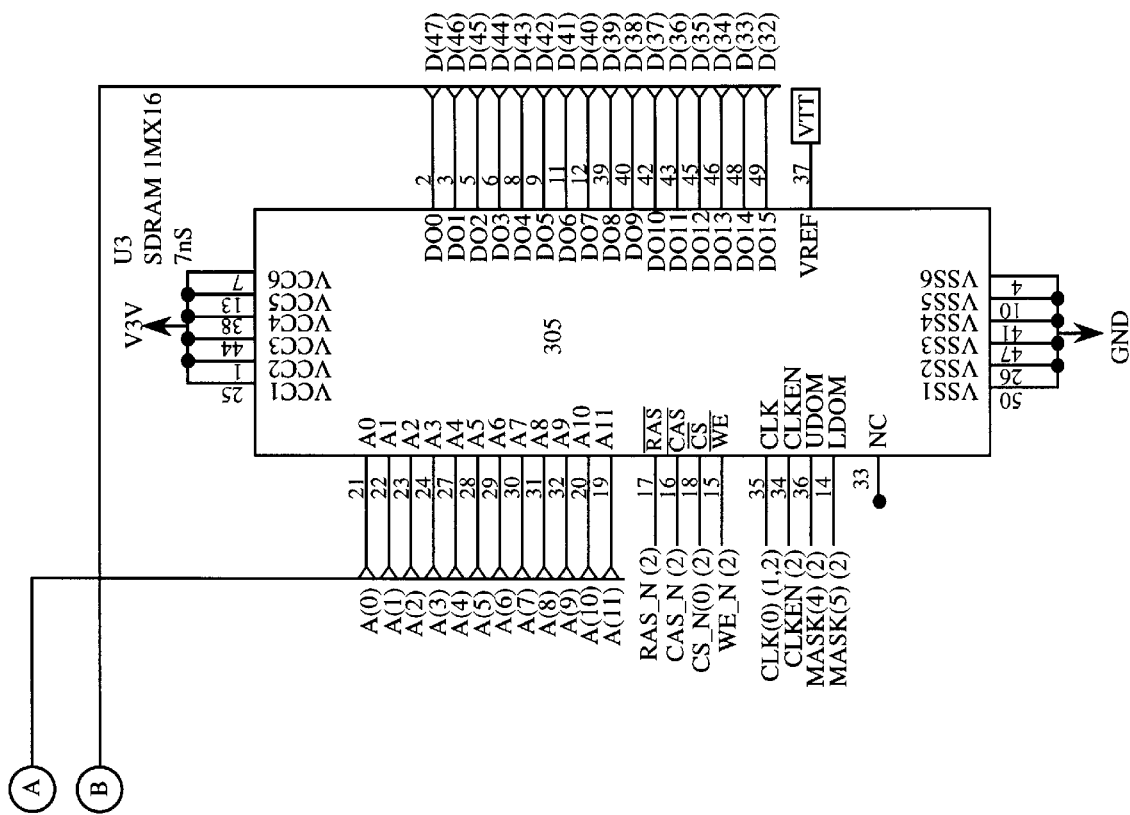
Figure 7:
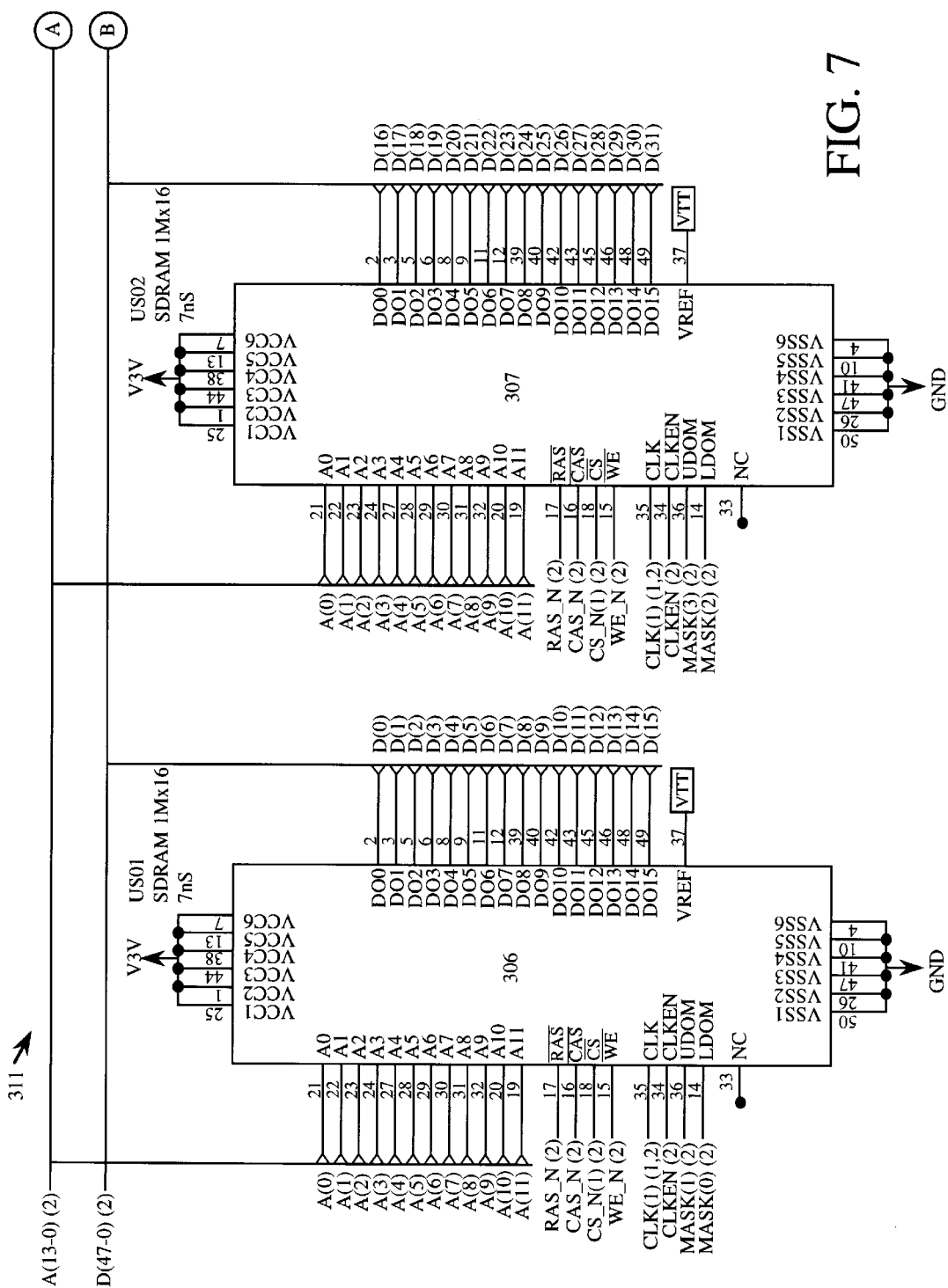
FIG. 7 is a diagram showing a second bank of memory components on a memory module that includes two banks of memory components in accordance with the present claimed invention.
Figure 7:
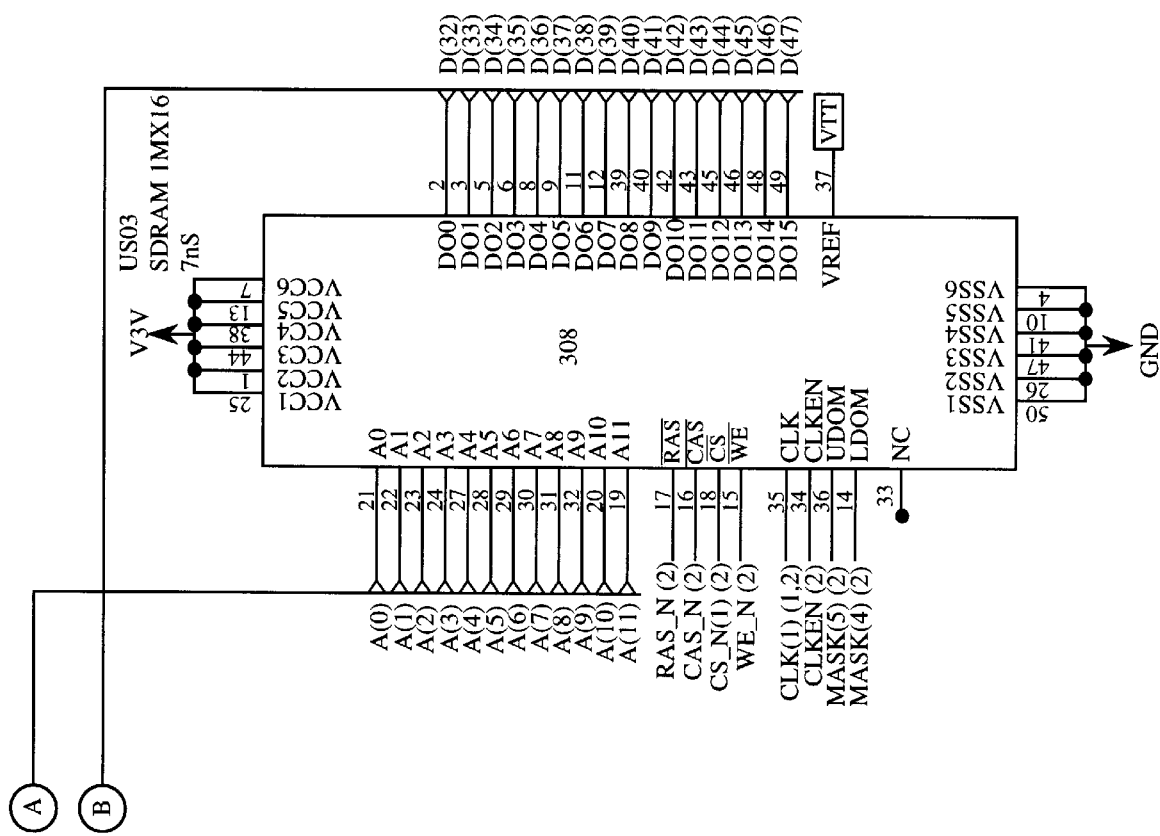

FIGS. 5–7 show the connections between memory components 303–308 and contact pads 1–120. Referring now to FIG. 5, contact pads 35, 87, couple chip select signals (CS). Row address strobe (RAS) signals are conveyed through connector pad 83. Column address strobe (CAS) signals are conveyed through connector pad 84. Write enable (WE) signals are conveyed through connector pad 38. Mask (MASK) signals are conveyed through contact pads 8, 23, 113, 99, 68, and 69. Clock (CLK) signals are conveyed through contact pads 53 and 10. Clock enable (CLKEN) signals are conveyed through connector pad 88. Identification (ID) signals are conveyed through connector pad 39. Voltage (V3V) is conveyed through contact pads 14, 18, 27, 31, 37, 40, 57, 64, 70, 76, 82, 95, 100, 106, 112, and 117. In one embodiment, a voltage of 3.3 volts is used. Ground (GND) is coupled through contact pads 1, 4, 9, 11, 22. 34, 43, 49, 52, 54, 60, 61, 67, 73, 79, 85, 91, 98, 103, 109, 114, and 120. Termination supply (VTT) signals are coupled through contact pads 7, 24, and 46.

Continuing with FIG. 5, data (D) signals are conveyed through contact pads 2, 3, 5, 6, 12, 13, 15, 16, 17, 19, 20, 21, 41, 42, 44, 45, 47, 48, 50, 51, 55, 56, 58, 59, 62, 63, 65, 66, 71, 72, 74, 75, 77, 78, 80, 81, 101, 102, 104, 105, 107, 108, 110, 111, 115, 116, 118, and 119. Address and control signals (A) are coupled through contact pads 25, 26, 28, 29, 30, 89, 90, 92, 93, 94, 96, and 97.

FIG. 6 shows the connections to the first bank of memory components. That is, connections to bank 310 of memory components are shown. It can be seen that data signals and address/control signals are coupled to each of memory components 303–305. In addition, chip select, row address strobe, column address strobe, write enable, mask, clock, and clock enable signals are coupled to each of memory components 303–305. Power (V3V), termination supply, and ground connections also couple to each of memory components 303–305. Similarly, FIG. 7 shows the connections to bank 311 of memory components. It can be seen that data signals and address/control signals are coupled to each of memory components 306–308. In addition, chip select, row address strobe, column address strobe, write enable, mask, clock, and clock enable signals are coupled to each of memory components 306–308. Power (V3V), termination supply, and ground connections also couple to each of memory components 306–308.

Figure 8:
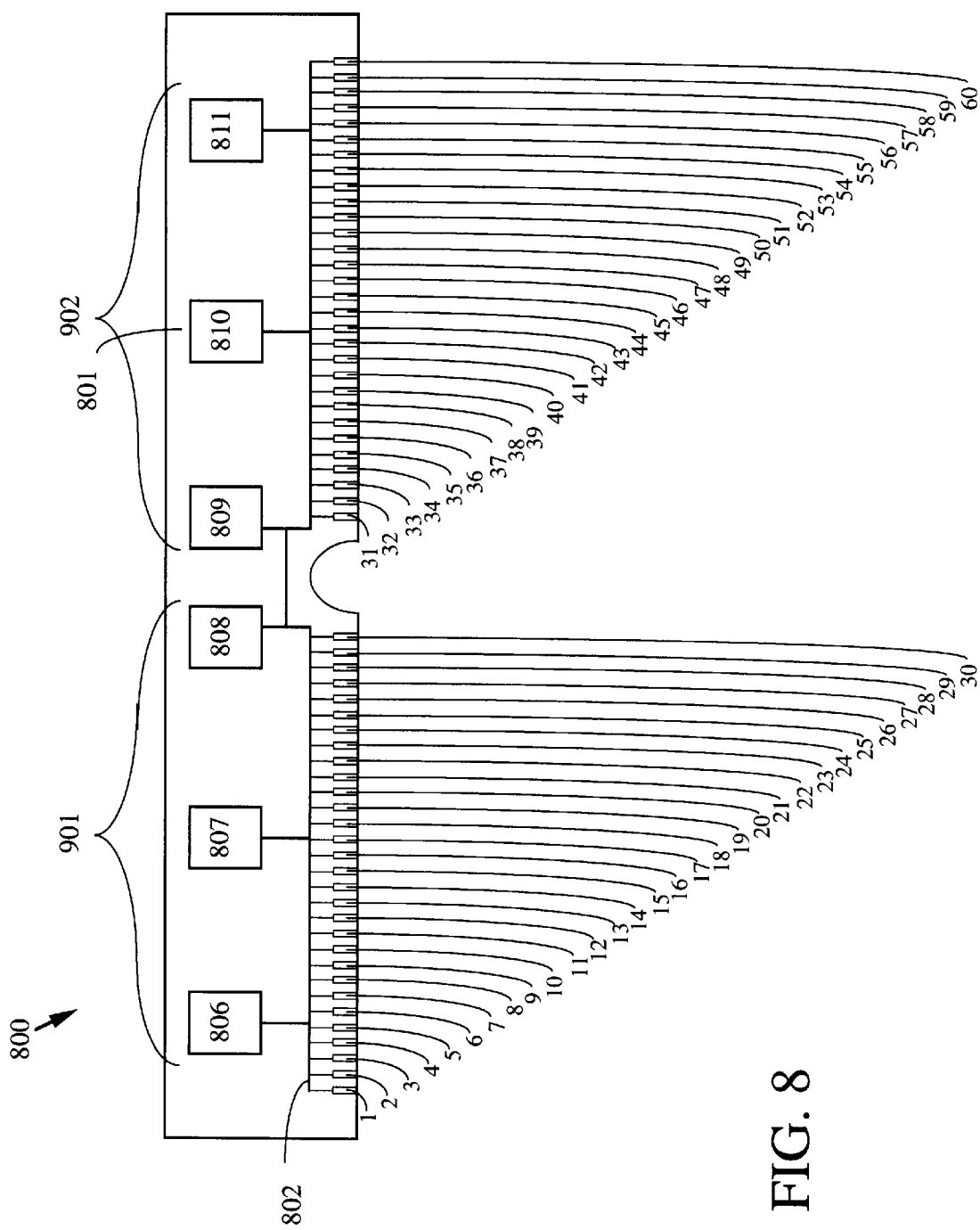
FIG. 8 is front side view of a memory module that includes four banks of memory components in accordance with the present claimed invention.

FIGS. 8–12 show a specific embodiment that includes four banks of memory components. Referring now to FIG. 8, memory module 800 is shown to include two banks of memory components, bank 901, and bank 902 on its front side. Bank 901 includes memory components 806–808. Bank 902 includes memory components 809–811. Memory components 806–811 are attached to circuit card 801 and are selectively electrically coupled to contact pads 1–120 by conductive traces 802.

Figure 9:
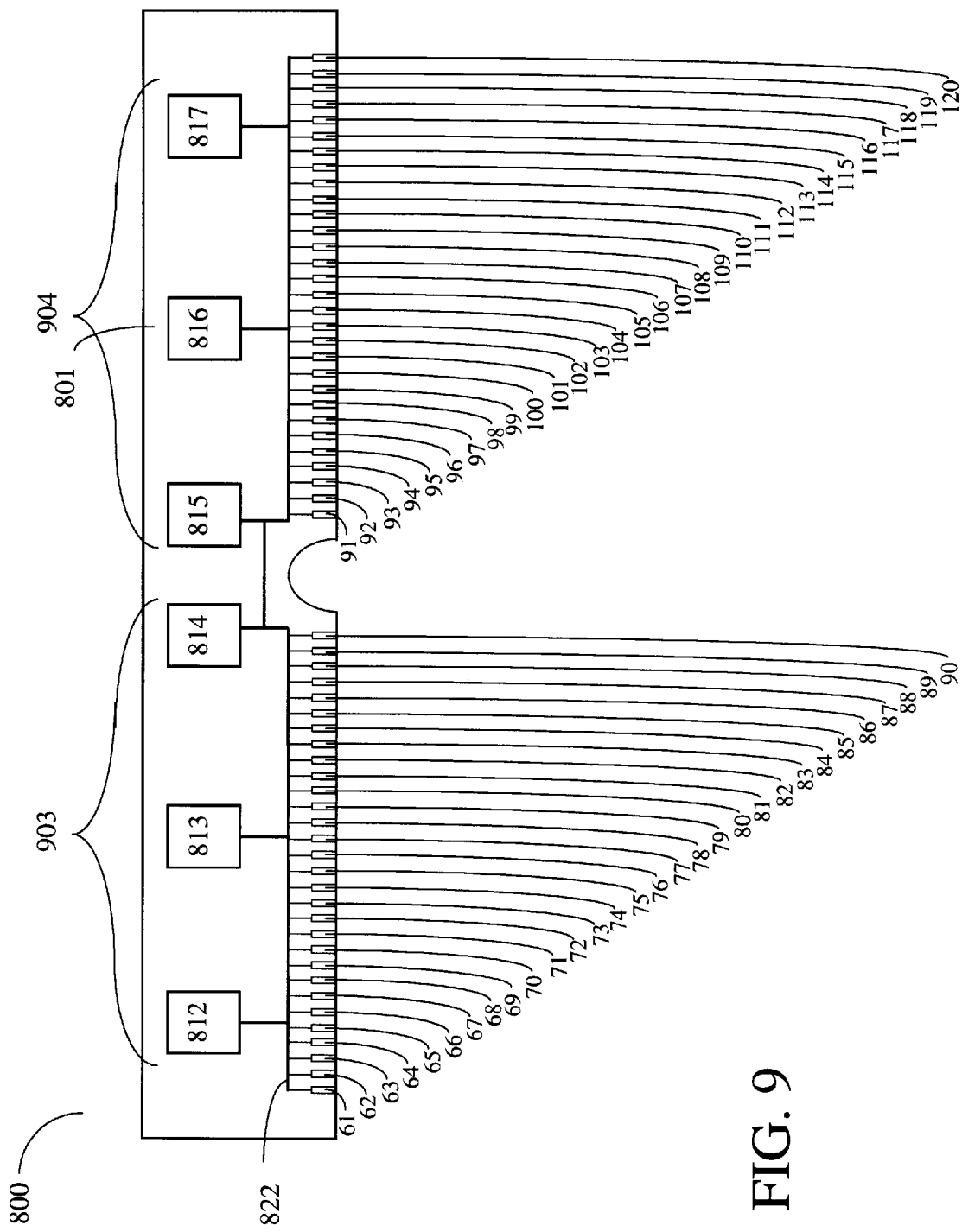
FIG. 9 is rear side view of the memory module shown in FIG. 8 in accordance with the present claimed invention.

Referring now to FIG. 9, the opposite side of system memory module 800 is shown to also include two banks of memory components, bank 903, and bank 904. Bank 903 includes memory components 812–814 and bank 904 includes memory components 815–817. Memory components 812–817 are selectively electrically coupled to contact pads 1–120 by conductive traces 822.

Figure 10:
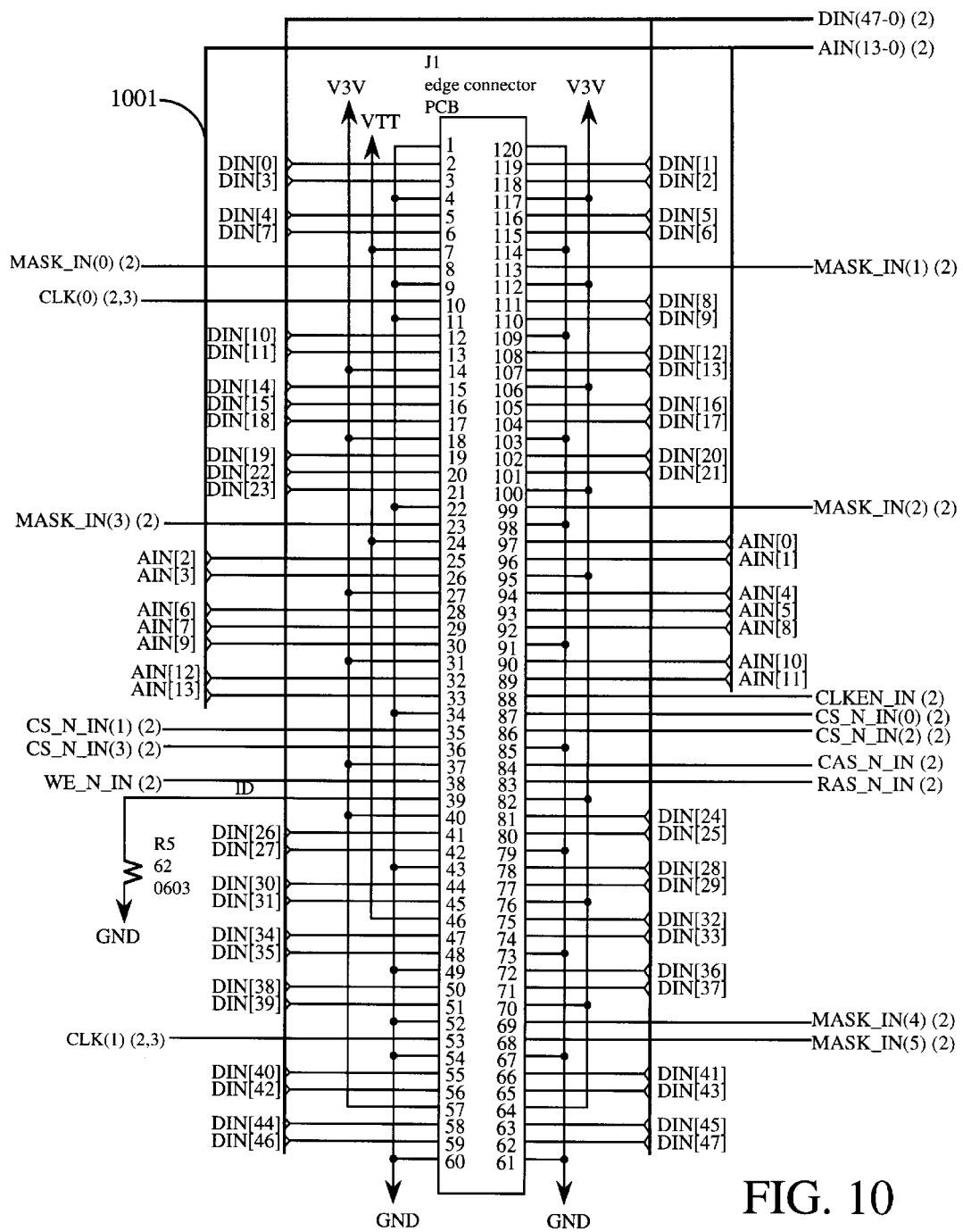
FIG. 10 is a diagram showing a memory module that includes four banks of memory components in accordance with the present claimed invention.

FIGS. 10–14 show the connections between memory components 806–817 and contact pads 1–120. Referring now to FIG. 10, contact pads 35, 36, 86, and 87 couple chip select signals (CS). Row address strobe (RAS) signals are conveyed through connector pad 83. Column address strobe (CAS) signals are conveyed through connector pad 84. Write enable (WE) signals are conveyed through connector pad 38. Mask (MASK) signals are conveyed through contact pads 8, 23, 68, 69, 99, and 113. Clock (CLK) signals are conveyed through contact pads 53 and 10. Clock enable (CLKEN) signals are conveyed through connector pad 88. Identification (ID) signals are conveyed through connector pad 39. Voltage (V3V) is conveyed through contact pads 14, 18, 27, 31, 37, 40, 57, 64, 70, 76, 82, 95, 100, 106, 112, and 117. In one embodiment, a voltage of 3.3 volts is used. Ground (GND) is coupled through contact pads 1, 4, 9, 11, 22, 34, 43, 49, 52, 54, 60, 61, 67, 73, 79, 85, 91, 98, 103, 109, 114, and 120. Termination supply (VTT) signals are coupled through contact pads 7, 24, and 46.

Continuing with FIG. 10, data (D) signals are conveyed through contact pads 2, 3, 5, 6, 12, 13, 15, 16, 17, 19, 20, 21, 41, 42, 44, 45, 47, 48, 50, 51, 55, 56, 58, 59, 62, 63, 65, 66, 71, 72, 74, 75, 77, 78, 80, 81, 101, 102, 104, 105, 107, 108, 110, 111, 115, 116, 118, and 119. Address and control signals (A) are coupled through contact pads 25, 26, 28, 29, 30, 32, 33, 89, 90, 92, 93, 94, 96, and 97.

Figure 11:
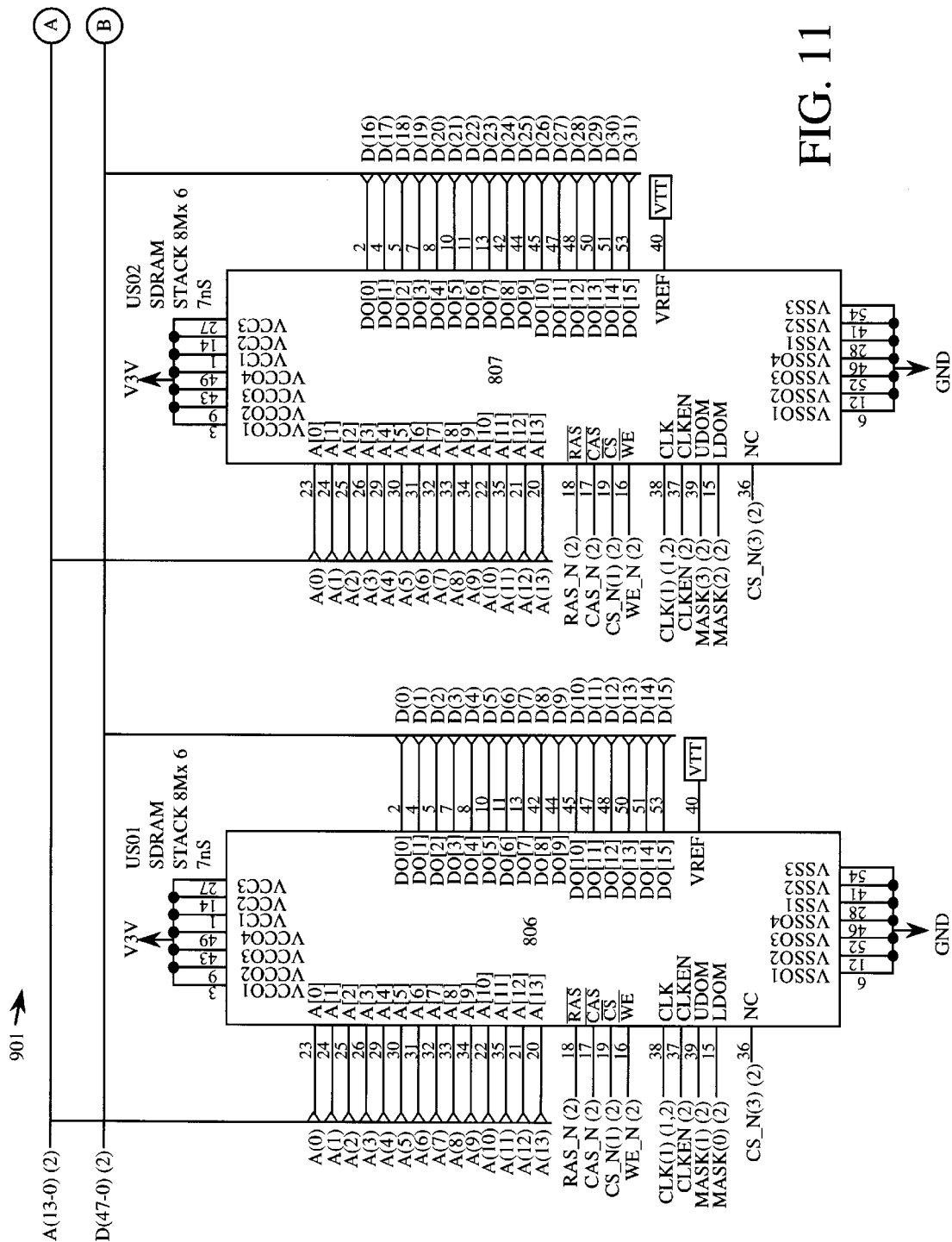
FIG. 11 is a diagram showing a first bank of memory components on a memory module that includes four banks of memory components in accordance with the present claimed invention.
Figure 11:
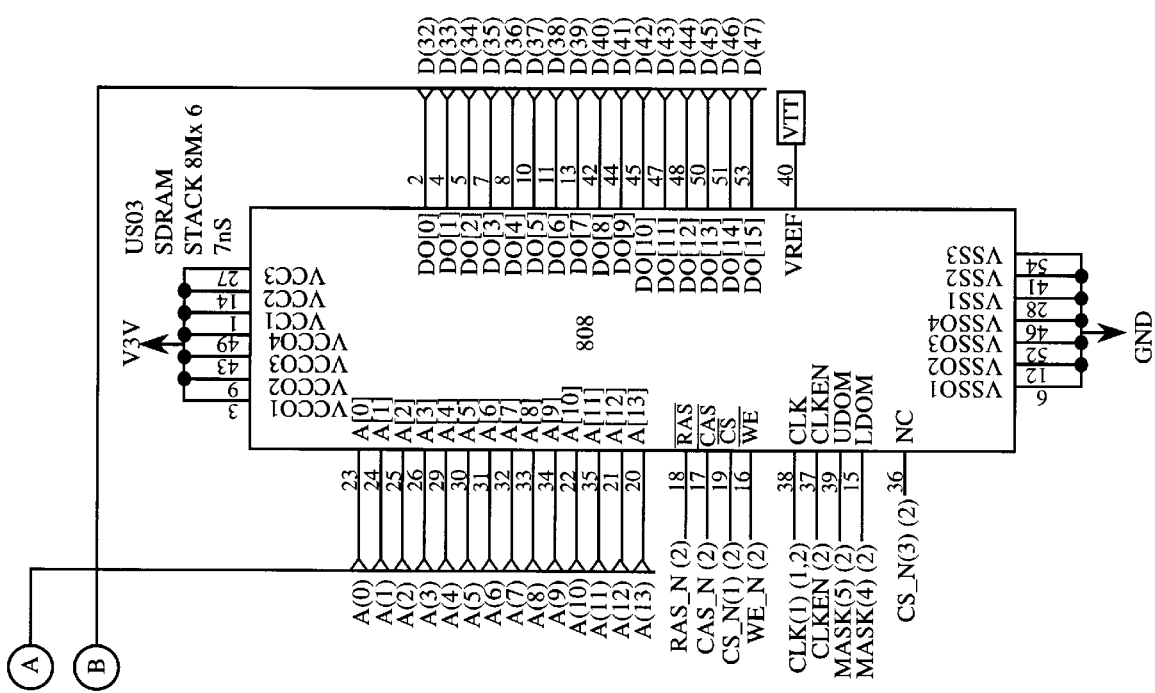

Referring now to FIGS. 11–14, connections to memory components 806–817 are shown. FIG. 11 shows the connections to the first bank of memory components. That is, connections to bank 901 of memory components is shown. It can be seen that data signals and address/control signals are coupled to each of memory components 806–808. In addition, chip select, row address strobe, column address strobe, write enable, mask, clock, and clock enable signals are coupled to each of memory components 806–808. Power (V3V), termination supply, and ground connections also couple to each of memory components 806–808.

Figure 12:
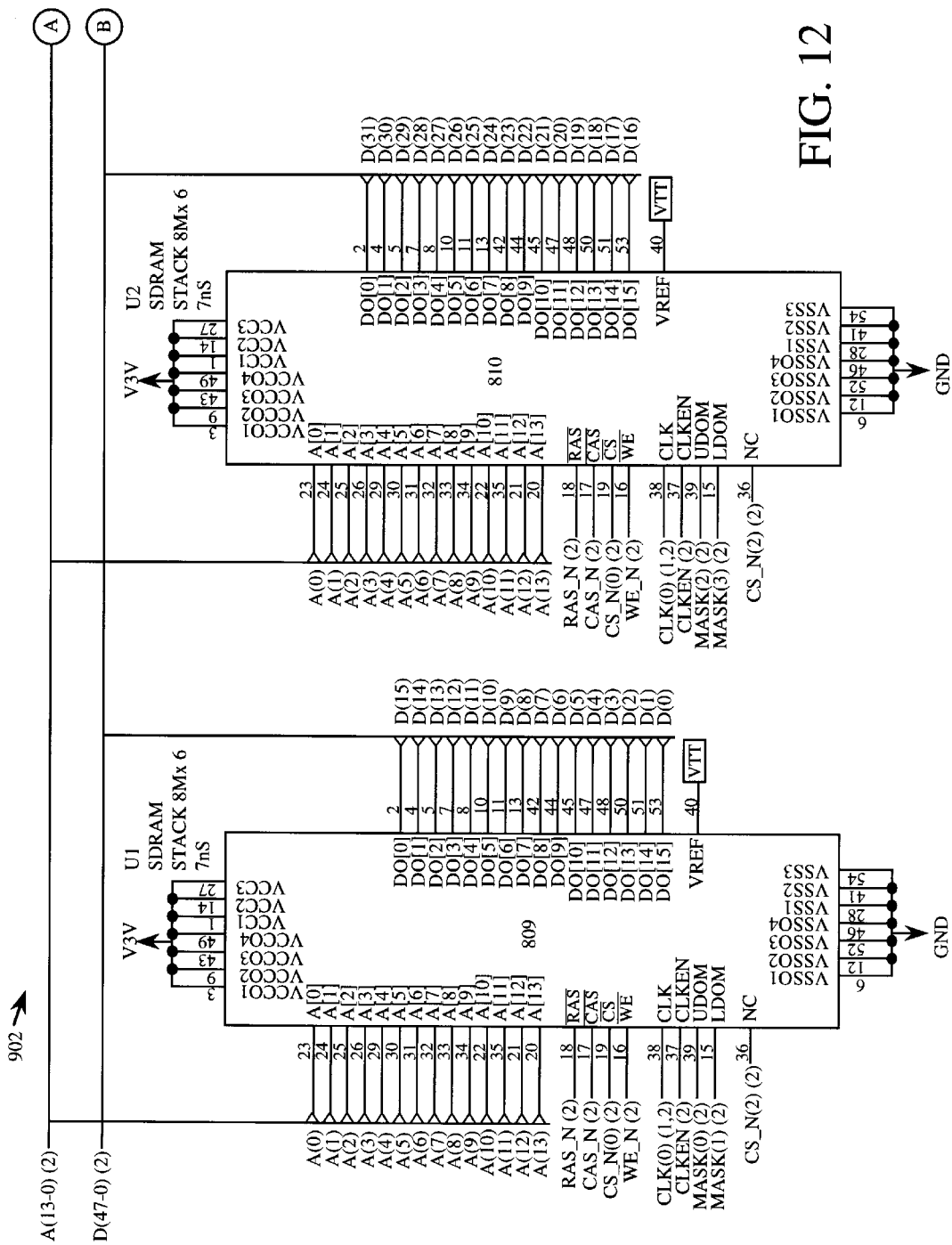
FIG. 12 is a diagram showing a second bank of memory components on a memory module that includes four banks of memory components in accordance with the present claimed invention.
Figure 12:
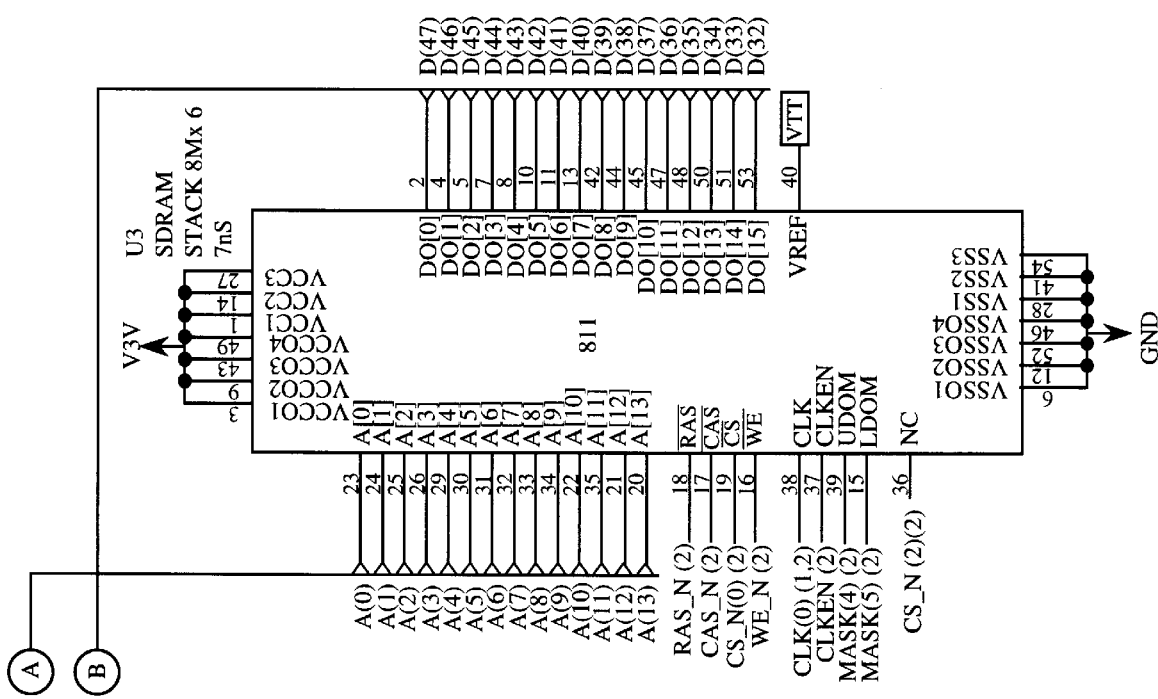

Referring to FIG. 12, the connections to bank 902 of memory components are shown. It can be seen that data signals and address/control signals are coupled to each of memory components 809–811. In addition, chip select, row address strobe, column address strobe, write enable, mask, clock, and clock enable signals are coupled to each of memory components 809–811. Power (V3V), termination supply, and ground connections also couple to each of memory components 809–811.

Figure 13:
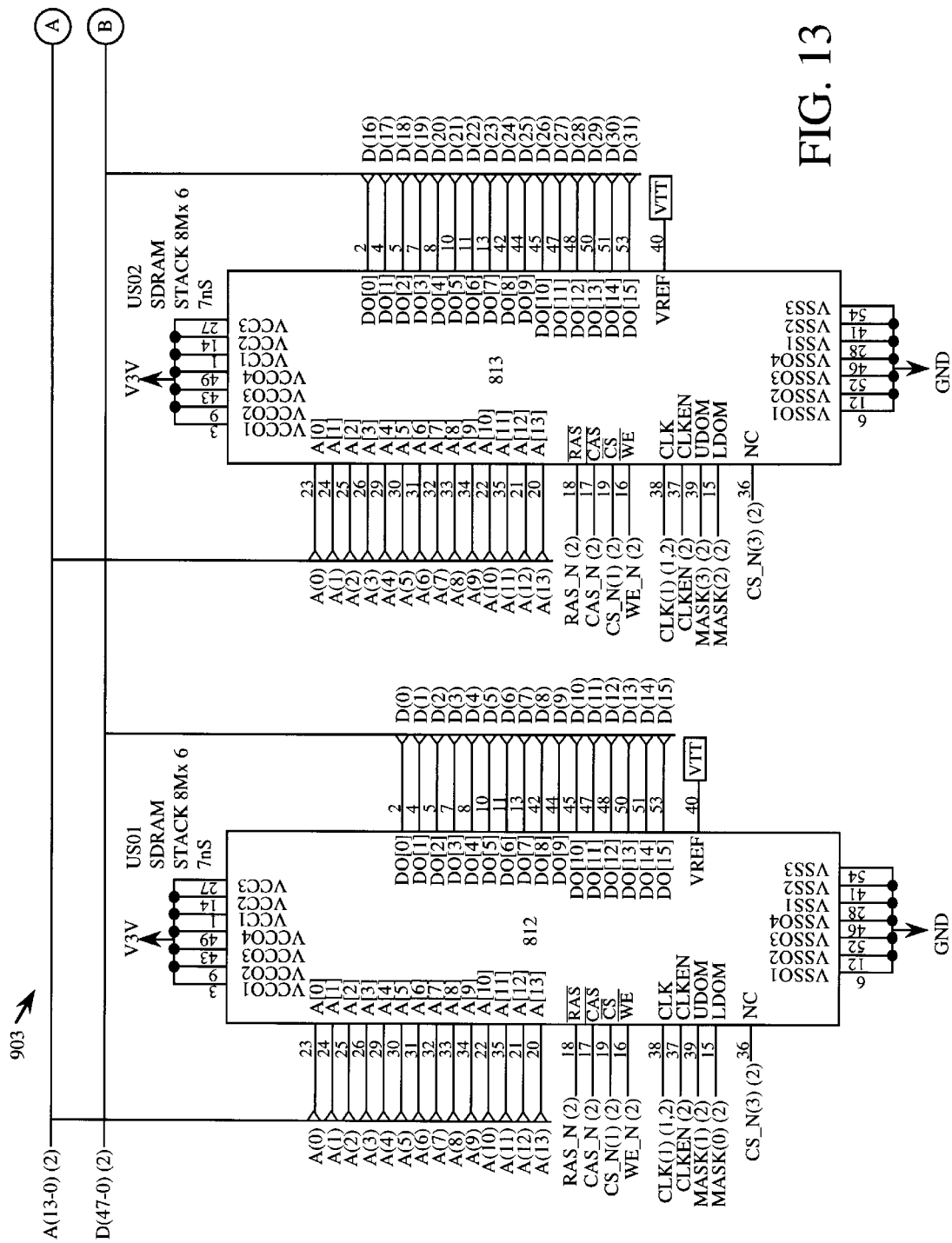
FIG. 13 is a diagram showing a third bank of memory components on a memory module that includes four banks of memory components in accordance with the present claimed invention.
Figure 13:
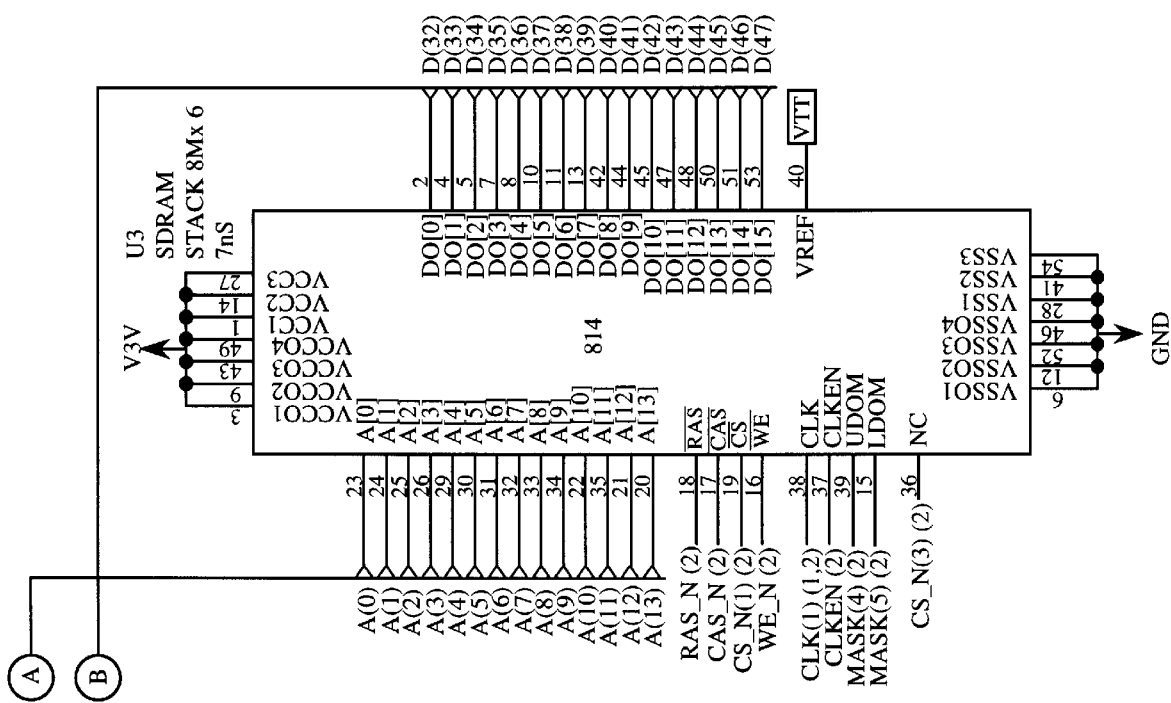

FIG. 13 shows the connections to bank 903 of memory components are shown. It can be seen that data signals and address/control signals are coupled to each of memory components 812–814. In addition, chip select, row address strobe, column address strobe, write enable, mask, clock, and clock enable signals are coupled to each of memory components 812–814. Power (V3V), termination supply, and ground connections also couple to each of memory components 812–814.

Figure 14:
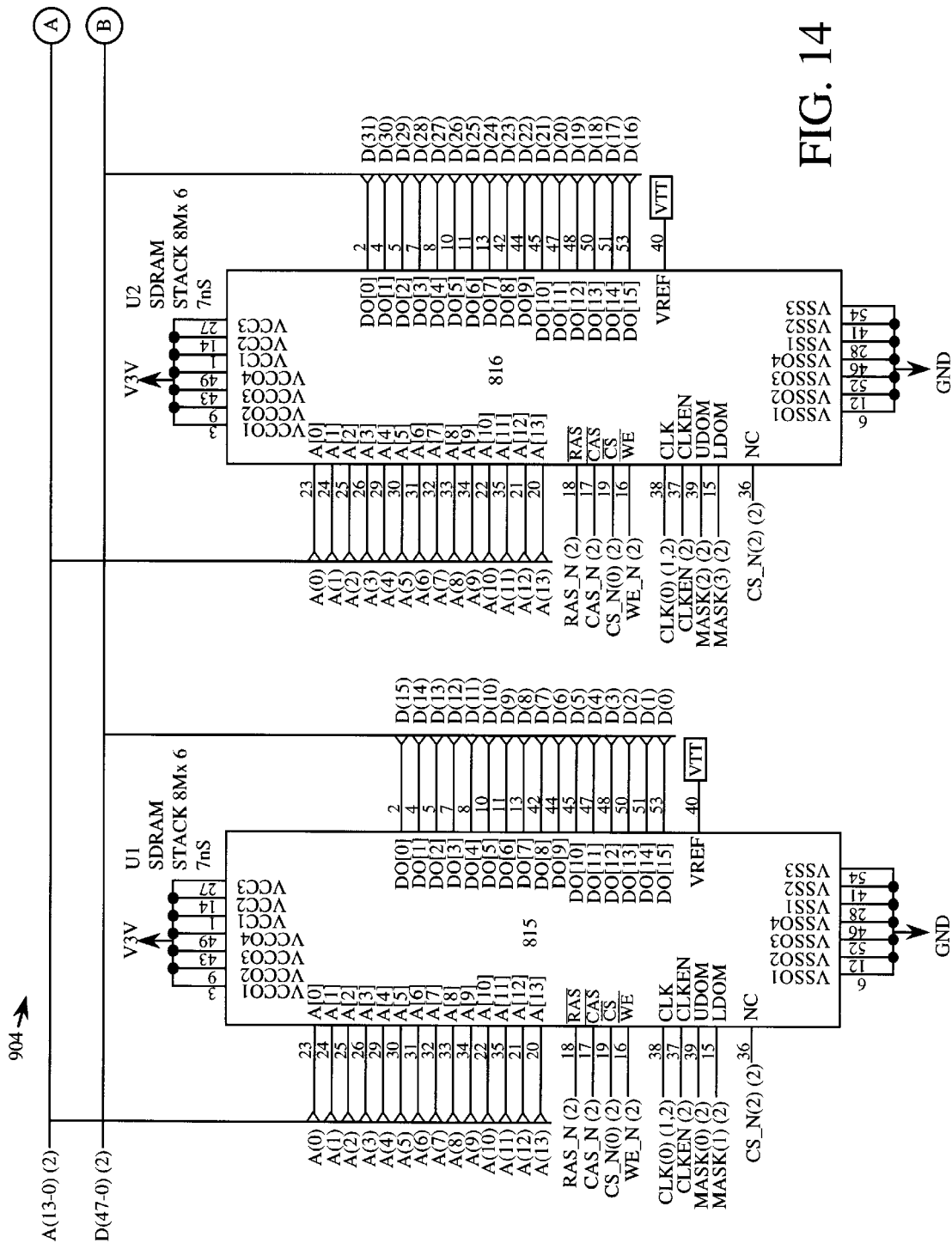
FIG. 14 is a diagram showing a fourth bank of memory components on a memory module that includes four banks of memory components in accordance with the present claimed invention.
Figure 14:
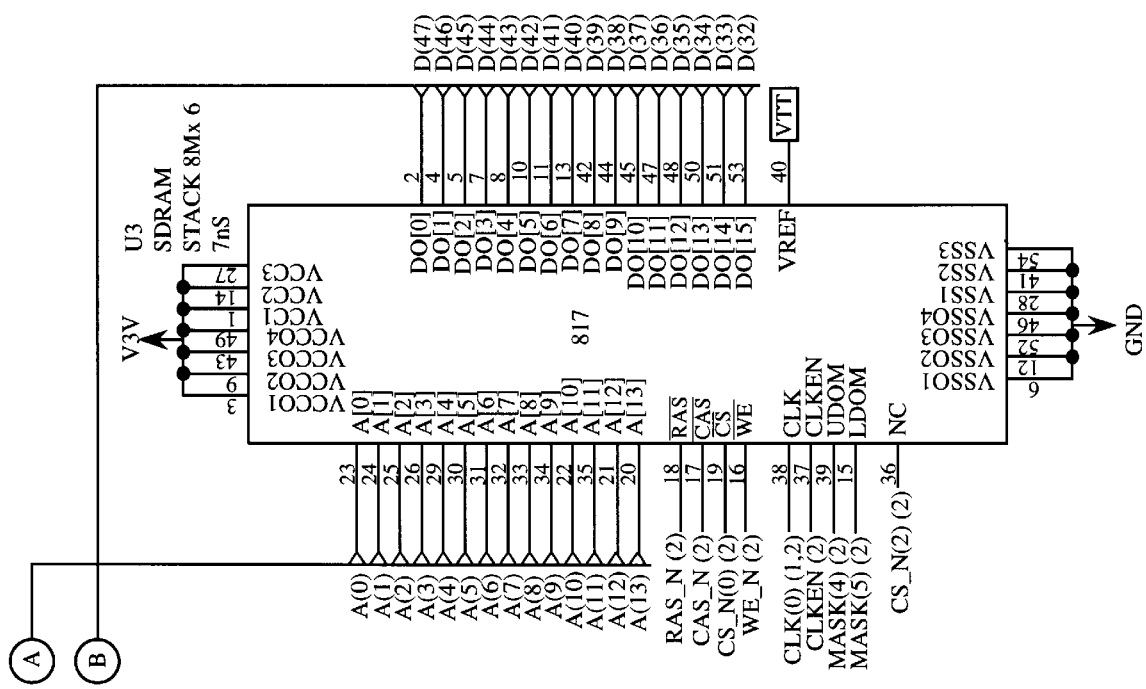

Referring now to FIG. 14, the connections to bank 904 of memory components is shown. It can be seen that data signals and address/control signals are coupled to each of memory components 815–817. In addition, chip select, row address strobe, column address strobe, write enable, mask, clock, and clock enable signals are coupled to each of memory components 815–817. Power (V3V), termination supply, and ground connections also couple to each of memory components 815–817.

The embodiment shown in FIGS. 1–14 may use any of a number of different types of memory components. Some of the DRAM populations that may be used are 16 Mbit single sided DRAMS, 16 bit double sided DRAMS, 64 Mbit single sided, 64 Mbit double sided, and 64 Mbit stacked SDRAM.

The embodiment shown in FIGS. 1–14 use high-order address decoding. The chip select signals are also high order mapped. In one embodiment, resistive series termination between the contact pads and the DRAMs is used to both isolate the capacitive loading of the DRAMS from the motherboard busses, and to develop the correct DC voltage levels for read data from the module. In an embodiment in which single-sided DRAMs are used, address, row address strobe, column address strobe, write enable, chip select, and clock enable signals have a resistive termination of 56 ohms. In an embodiment in which double-sided DRAMs are used, address, row address strobe, column address strobe, write enable, chip select, and clock enable signals have a resistive termination of 27 ohms. In an embodiment in which stacked DRAMs are used, address, row address strobe, column address strobe, write enable, chip select, and clock enable signals have a resistive termination of 13 ohms. In one embodiment, the clock signals are terminated on the motherboard to avoid generating excessive EMI from unpopulated connector receptacles.

Continuing with FIGS. 1–14, in one embodiment, the motherboard provides a nominal 1.5 volts termination supply (VTT) with the termination supply set to track the 3.3 V supply at a 0.045 ratio.

Referring still to FIGS. 1–9, memory modules 100, 300, and 800 are designed to support 100 megahertz (MHz) operation and 133 MHz operation. In one embodiment, SDRAMS are used to support 133 MHz operation. For 133 MHz operation, the ID signal is an open circuit. 100 MHz operation is supported using fast mode SDRAMS (CL3) and slow mode SDRAMS (CL2). If the DRAMs only support slow-mode operation, the ID signal on the memory module is grounded. If the DRAMs support fast-mode operation, the ID signal is an open circuit. The memory timing for these three modes of operations, in nanoseconds (ns), and in cycles as shown is:

| Parameter | 100 MHz CL2 | 100 MHz CL3 | 133 MHz |
| --- | --- | --- | --- |
| Clock cycle time (Tck) min | 10 ns | 10 ns | 7.5 ns |
| Clock high time (Tch) min | 3.5 ns | 3.5 ns | 2.5 ns |
| Clock low time (Tcl) min | 3.5 ns | 3.5 ns | 2.5 ns |
| Data access time (Tac) max | 6 ns | 6 ns | 5 ns |
| Data output hold time (Toh) min | 2 ns | 2 ns | 2 ns |
| Data output low impedance (Tlz) min | 0 ns | 0 ns | 0 ns |
| Data output high impedance (Thz) max | 8 ns | 8 ns | 7 ns |
| Data input setup time (Tds) min | 2 ns | 2 ns | 2 ns |
| Data input hold time (Tdh) min | 1 ns | 1 ns | 1 ns |
| Address/control input setup time (Tis) min | 2 ns | 2 ns | 2 ns |
| Address/control input hold time (Tih) min | 1 ns | 1 ns | 1 ns |
| Row cycle time (Trc) | 7 cycles | 8 cycles | 10 cycles |
| Row access time (Tras) | 5 cycles | 5 cycles | 7 cycles |
| Row precharge (Trp) | 2 cycles | 3 cycles | 3 cycles |
| Inter-bank row to row activate time (Trrd) | 2 cycles | 2 cycles | 2 cycles |
| Inter-bank column-column activate time(Trcd) | 2 cycles | 3 cycles | 3 cycles |
| Write data to precharge latency (Tdpl) | 1 cycle | 1 cycle | 1 cycle |

Data access time, Data output hold time, Data output low impedance, and Data output high impedance are measured from the clock signal's rising edge. Row cycle time is measured from refresh/activate to refresh/activate. Row access time is from row address to read data, and Row precharge time is from precharge to refresh/activate.

Figure 15:
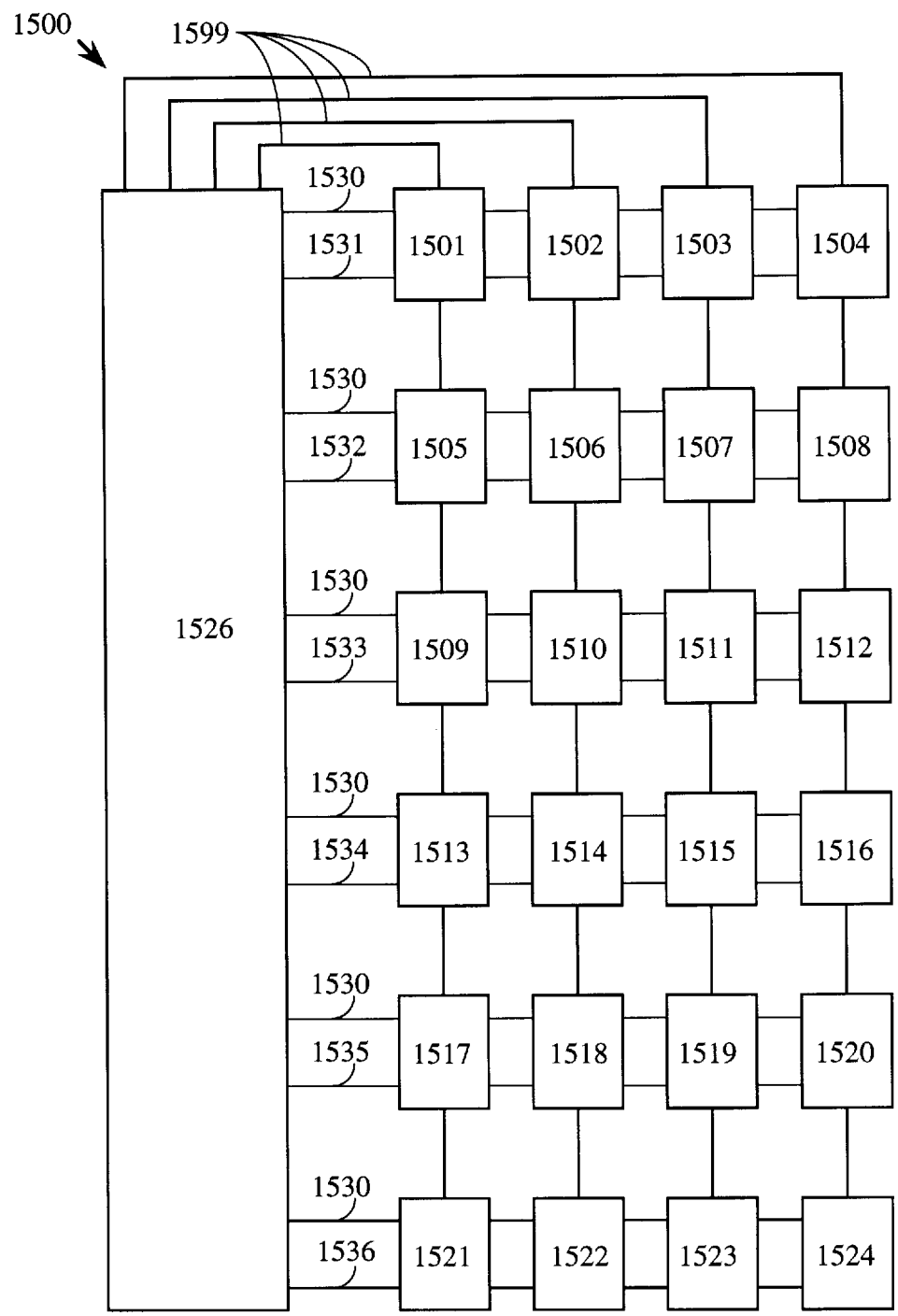
FIG. 15 is a schematic representation of a memory system that includes twenty four memory modules in accordance with the present claimed invention.

FIG. 15 shows a logical representation of memory system 1500 that includes provision for the attachment of 24 memory modules to memory controller 1526. In the embodiment shown in FIG. 15, memory modules 1501–1524 are shown to be disposed into connector receptacle slots such that the system includes 24 memory modules. Data bus 1530 couples data between memory controller 1526 and memory components in each of memory modules 1501–1524. Chip select bus 1599 is shown to include connections to each of memory modules 1501–1524.

Continuing with FIG. 15, each of address/control busses 1531–1536 addresses four memory modules. More particularly, each of address/control busses 1531–1536 addresses the memory components contained within four memory modules. That is, address/control bus 1531 addresses the memory components in each of memory modules 1501–1504. Similarly, address/control bus 1532 addresses the memory components in each of memory modules 1505–1508 and address/control bus 1533 addresses the memory components in each of memory modules 1509–1512. Likewise, address/control bus 1534 addresses the memory components in each of memory modules 1513–1516, address/control bus 1535 addresses the memory components in each of memory modules 1517–1520, and address/control bus 1536 addresses the memory components in each of memory modules 1521–1524.

Continuing with FIG. 15, in one embodiment, memory modules 1501–1524 each include one bank of memory components. Alternatively, memory modules with multiple banks of memory components such as, for example, memory module 300 of FIGS. 3–7, or memory module 800 of FIGS. 8–14 could be used.

The memory components of the present invention may be addressed such that different parts of a memory word may be separately addressed with a unique address. More particularly, the use of multiple memory address/control busses per memory word allows for the presentation of different address on one or more of the address/control busses in a given clock period. This allows for the access of unaligned data in a single memory clock period. This is particularly advantageous for 3D graphics applications such as texture mapping where data structures may not be ideally aligned with respect to the memory word. This allows for accessing unaligned texture mapping data in a sustained fashion by presenting different address information on one or more of the address busses every memory clock period, and independently updating each of the memory/address control busses on successive memory clock periods. Thus, the system memory module of the present invention meets the needs of recent graphics rendering engines and provides good 3D Graphics performance.

The memory system and memory modules disclosed in FIGS. 1–15 results in a reduction in the physical and logical width of the memory modules while providing the necessary bandwidth so as to allow for fast access and control of memory components. In addition, using multiple memory modules, each with its own address/control bus that couples to the computer system's memory controller, coupled with the use of multiple memory components on each memory module, minimizes the number of memory address/control busses required on the memory controller itself. In addition, since the memory system of the present invention does not require intermediate buffers between the memory controller and the memory components as is required in comparable prior art systems, there is no increase in the latency of supplying address/control information to the memory components.

The present invention also provides mechanical and manufacturing yield benefits. As the density of memory component integrated circuit packaging increases, the density of memory module connectors must also increase or there would be an undesirable increase in the electrical length of signal traces on the memory module to fan-in a low-density memory module connector to the higher-density memory component. For example, the pin count of memory components has increased from 20, to 40, to 60 pins per memory component over time. In order to maintain the same relative density, the memory module connector pitch needs to decrease correspondingly (i.e. from 1.27 mm, to 1 mm, to 0.65 mm, and smaller). At these finer connector pitches it is increasingly difficult to cost effectively meet the mechanical tolerance requirements across very long module connectors. In addition, with the increased number of signals per unit length, the required memory module printed circuit board technology level increases, making memory modules more sensitive to manufacturing yield defects. Both of these issues are addressed by breaking up the traditional memory module into multiple narrower memory modules such that the cumulative tolerance stackup ratio of contact pitch to connector length is maintained.

In addition, the narrower memory module of the present invention allows for increased manufacturing yield of memory modules per printed circuit board panel. Moreover, since the resulting memory modules are shorter than comparable prior art memory modules, the memory modules of the present invention may be more readily placed close to the corresponding signal pins of the memory controller to minimize the length of signal traces on the system printed circuit board.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

We claim:

1. A memory system comprising:

a memory controller;

a plurality of connector receptacles;

a plurality of memory modules disposed within said plurality of connector receptacles, each of said memory modules having a plurality of contact pads disposed thereon and a plurality of memory components disposed thereon, said ones of said plurality of contact pads selectively electrically coupled to said plurality of memory components;

a data bus coupled to said memory controller and coupled to each of said plurality of connector receptacles for transmitting data signals between said memory controller and said plurality of memory components; and a plurality of address and control busses coupled to said memory controller, each of said address and control busses coupled to one of said plurality of connector receptacles for transmitting address and control signals between said memory controller and said plurality of memory components.

2. The memory system of claim 1 further comprising:

a chip select bus coupled to said memory controller and coupled to each of said connector receptacles for transmitting chip select signals between said memory controller and said memory components.

3. The memory system of claim 2 wherein said data bus is a 48 bit data bus.

4. A memory module adapted to be coupled to a connector receptacle of a computer, said memory module comprising:

a plurality of contact pads; and a plurality of memory components, each of said plurality of memory components selectively electrically coupled to ones of said plurality of contact pads; and a plurality of conductive traces, said plurality of conductive traces connected to ones of said plurality of contact pads and selectively coupled to said plurality of memory components, 48 of said plurality of contact pads adapted to couple data signals.

5. The memory module of claim 4 wherein said plurality of contact pads comprises 120 contact pads.

6. The memory module of claim 4 wherein contact pads 2, 3, 5, 6, 12, 13, 15, 16, 17, 19, 20, 21, 41, 42, 44, 45, 47, 48, 50, 51, 55, 56, 58, 59, 62, 63, 65, 66, 71, 72, 74, 75, 77, 78, 80, 81, 101, 102, 104, 105, 107, 108, 110, 111, 115, 116, 118, and 119 are adapted to couple data signals.

7. The memory module of claim 4 wherein 12 or more of said contact pads are adapted to couple address and control signals between said memory components and said connector receptacle of said computer.

8. The memory module of claim 4 wherein contact pads 25, 26, 28, 29, 30, 89, 90, 92, 93, 94, 96, and 97 are adapted to couple address and control signals.

9. The memory module of claim 4 wherein contact pads 25, 26, 28, 29, 30, 32, 33, 89, 90, 92, 93, 94, 96, and 97 are adapted to couple address and control signals.

10. The memory module of claim 4 wherein contact pads 35 and 87 are adapted to couple chip select signals.

11. The memory module of claim 5 wherein contact pad 83 is adapted to couple row address strobe signals.

12. The memory module of claim 4 wherein contact pad 84 is adapted to couple column address strobe signals.

13. The memory module of claim 4 wherein contact pads 38 is adapted to couple write enable signals.

14. The memory module of claim 4 wherein contact pads 8, 23, 113, 99, 68, and 69 are adapted to couple mask signals.

15. The memory module of claim 4 wherein contact pads 10 and 53 are adapted to couple clock signals.

16. The memory module of claim 15 wherein contact pad 88 is adapted to couple clock enable signals.

17. The memory module of claim 16 wherein contact pad 39 is adapted to couple identification signals.

18. A memory module adapted for use with computer that includes a memory controller and a connector receptacle, said memory module comprising:

a plurality of contact pads, said plurality of contact pads adapted to couple to said connector receptacle; and a plurality of memory components, each of said plurality of memory components coupled to ones of said plurality of contact pads, 48 of said plurality of contact pads adapted to couple data input and output signals and 12 or more of said plurality of contact pads adapted to couple address and control signals.

19. The memory module of claim 18 wherein contact pads 2, 3, 5, 6, 12, 13, 15, 16, 17, 19, 20, 21, 41, 42, 44, 45, 47, 48, 50, 51, 55, 56, 58, 59, 62, 63, 65, 66, 71, 72, 74, 75, 77, 78, 80, 81, 101, 102, 104, 105, 107, 108, 110, 111, 115, 116, 118, and 119 are adapted to couple data signals.

20. The memory module of claim 18 wherein voltage is conveyed through contact pads 14, 18, 27, 31, 37, 40, 57, 64, 70, 76, 82, 95, 100, 106, 112, and 117.

21. The memory module of claim 20 wherein contact pads 7, 24, and 46 are adapted to couple termination supply signals.

22. The memory module of claim 21 wherein contact pads 1, 4, 9, 11, 22. 34, 43, 49, 52, 54, 60, 61, 67, 73, 79, 85, 91, 98, 103, 109, 114, and 120 are adapted to couple ground signals.

* * * * *